(12) United States Patent
Tang et al.

(10) Patent No.: US 9,818,931 B2
(45) Date of Patent: Nov. 14, 2017

(54) METHOD AND SYSTEM FOR PROVIDING MAGNETIC JUNCTIONS USING THERMALLY ASSISTED SPIN TRANSFER TORQUE SWITCHING

(71) Applicant: Samsung Electronics Co., LTD., Gyeonggi-do (KR)

(72) Inventors: Xueti Tang, Fremont, CA (US); Jang-Eun Lee, Cupertino, CA (US); Gen Feng, North Potomac, MD (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/981,391

(22) Filed: Dec. 28, 2015

(65) Prior Publication Data

US 2016/0197265 A1    Jul. 7, 2016

Related U.S. Application Data

(60) Provisional application No. 62/099,880, filed on Jan. 5, 2015.

(51) Int. Cl.
*H01L 43/02* (2006.01)
*H01L 43/08* (2006.01)
(Continued)

(52) U.S. Cl.
CPC .......... *H01L 43/02* (2013.01); *G11C 11/161* (2013.01); *G11C 11/1675* (2013.01);
(Continued)

(58) Field of Classification Search
CPC ........ H01L 43/02; H01L 43/08; H01L 43/10; H01L 43/12; G11C 11/161; G11C 11/1675
See application file for complete search history.

(56) References Cited

U.S. PATENT DOCUMENTS

| | | | |
|---|---|---|---|
| 6,667,897 B1 * | 12/2003 | Abraham | G11C 11/15 257/E27.005 |
| 2006/0098354 A1 | 5/2006 | Parkin | |

(Continued)

FOREIGN PATENT DOCUMENTS

EP    2278589    1/2011

OTHER PUBLICATIONS

Rahman, "Reduction of switching current density in perpendicular magnetic tunnel junctions by tuning the anisotropy of the cofeb free layer," Journal of Applied Physics, vol. 111, iss.7, Apr. 1, 2012.
(Continued)

*Primary Examiner* — Cheung Lee
*Assistant Examiner* — Stephen C Smith
(74) *Attorney, Agent, or Firm* — Convergent Law Group LLP

(57) ABSTRACT

A magnetic junction usable in a magnetic device and a method for providing the magnetic junction are described. The magnetic junction includes a free layer, a pinned layer and nonmagnetic spacer layer between the free and pinned layers. The free layer is switchable between stable magnetic states when a write current is passed through the magnetic junction. The write current generates joule heating such that the free layer has a switching temperature greater than room temperature. The free layer includes a multilayer that is temperature sensitive and has at least one bilayer. Each bilayer includes first and second layers. The first layer includes an alloy of a magnetic transition metal and a rare earth. The second layer includes a magnetic layer. The multilayer has a room temperature coercivity and a switching temperature coercivity. The switching temperature coercivity is not more than one-half of the room temperature coercivity.

21 Claims, 7 Drawing Sheets

(51) Int. Cl.
    *G11C 11/16*     (2006.01)
    *H01L 43/12*     (2006.01)
    *H01L 43/10*     (2006.01)
(52) U.S. Cl.
    CPC .............. *H01L 43/08* (2013.01); *H01L 43/10* (2013.01); *H01L 43/12* (2013.01)

(56) References Cited

U.S. PATENT DOCUMENTS

| | | |
|---|---|---|
| 2007/0201265 A1 | 8/2007 | Ranjan |
| 2008/0117552 A1 | 5/2008 | Zhou |
| 2010/0072524 A1 | 3/2010 | Huai |
| 2011/0044099 A1* | 2/2011 | Dieny ................ B82Y 25/00 365/171 |
| 2013/0001716 A1 | 1/2013 | Yamakawa |
| 2014/0038311 A1 | 3/2014 | Ouchi |
| 2014/0103469 A1 | 4/2014 | Jan |
| 2014/0141533 A1 | 5/2014 | Lai |
| 2014/0170856 A1 | 6/2014 | Nemani |
| 2014/0299951 A1 | 10/2014 | Guo |
| 2014/0306304 A1 | 10/2014 | Guo |
| 2014/0327095 A1 | 11/2014 | Kim |
| 2015/0129996 A1* | 5/2015 | Tang ................ H01L 43/12 257/427 |
| 2015/0171315 A1* | 6/2015 | Gan ................ H01F 10/3286 257/421 |
| 2016/0013401 A1* | 1/2016 | Whig ................ H01L 43/08 257/421 |

OTHER PUBLICATIONS

Tadisina, Z.R., "Perpendicular magnetic anisotropy materials for reduced current switching devices," The University of Alabama Department: Metallurgical/Materials Engineering, Dissertation/Thesis Dissertation/thesis No. 3409056, Jan. 1, 2012.

* cited by examiner

METHOD AND SYSTEM FOR PROVIDING MAGNETIC JUNCTIONS USING THERMALLY ASSISTED SPIN TRANSFER TORQUE SWITCHING

CROSS-REFERENCE TO RELATED APPLICATIONS

This application claims the benefit of provisional Patent Application Ser. No. 62/099,880, filed Jan. 5, 2015, entitled THERMAL FREE LAYER WITH [Tb/Co]n, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional pinned layer 16, a conventional tunneling barrier layer 18, and a conventional free layer 20. Also shown is top contact 22. Conventional contacts 14 and 22 are used in driving the current in a current-perpendicular-to-plane (CPP) direction, or along the z-axis as shown in FIG. 1. Typically, the conventional pinned layer 16 is closest to the substrate 12 of the layers 16, 18 and 20.

The conventional pinned layer 16 and the conventional free layer 20 are magnetic. The magnetization 17 of the conventional pinned layer 16 is fixed, or pinned, in a particular direction. Although depicted as a simple (single) layer, the conventional pinned layer 16 may include multiple layers. For example, the conventional pinned layer 16 may be a synthetic antiferromagnetic (SAF) layer including magnetic layers antiferromagnetically coupled through thin conductive layers, such as Ru. The conventional pinned layer 16 may also be another multilayer. The conventional free layer 20 has a changeable magnetization 21. Although depicted as a simple layer, the conventional free layer 20 may also include multiple layers. The conventional pinned layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 22 to the bottom contact 14, the magnetization 21 of the conventional free layer 20 may switch to be parallel to the magnetization 17 of the conventional pinned layer 16. When a sufficient current is driven from the bottom contact 11 to the top contact 22, the magnetization 21 of the free layer may switch to be antiparallel to that of the pinned layer 16. The differences in magnetic configurations correspond to different magnetoresistances and thus different logical states (e.g. a logical "0" and a logical "1") of the conventional MTJ 10.

Because of their potential for use in a variety of applications, research in magnetic memories is ongoing. Mechanisms for improving the performance of STT-RAM are desired. For example, a high perpendicular magnetic anisotropy and a high magnetoresistance are desired. Accordingly, what is needed is a method and system that may improve the performance of the spin transfer torque based memories. The method and system described herein address such a need.

BRIEF SUMMARY OF THE INVENTION

A magnetic junction usable in a magnetic device and a method for providing the magnetic junction are described. The magnetic junction includes a free layer, a pinned layer and nonmagnetic spacer layer between the free and pinned layers. The free layer is switchable between stable magnetic states when a write current is passed through the magnetic junction. The write current generates joule heating such that the free layer has a switching temperature greater than room temperature. The free layer includes a multilayer that is temperature sensitive and has at least one bilayer. Each bilayer includes first and second layers. The first layer includes an alloy of a magnetic transition metal and a rare earth. The second layer includes a magnetic layer. The multilayer has a room temperature coercivity and a switching temperature coercivity. The switching temperature coercivity is not more than one-half of the room temperature coercivity.

DETAILED DESCRIPTION OF THE INVENTION

Figure 1:
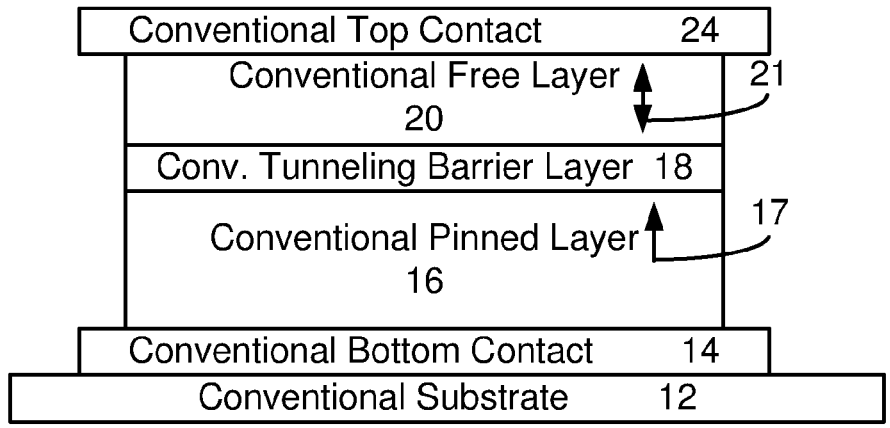
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A magnetic junction usable in a magnetic device and a method for providing the magnetic junction are described. The magnetic junction includes a free layer, a pinned layer and nonmagnetic spacer layer between the free and pinned layers. The free layer is switchable between stable magnetic states when a write current is passed through the magnetic junction. The write current generates joule heating such that the free layer has a switching temperature greater than room temperature. The free layer includes a multilayer that is temperature sensitive and has at least one bilayer. Each bilayer includes first and second layers. The first layer includes an alloy of a magnetic transition metal and a rare earth. The second layer includes a magnetic layer. The multilayer has a room temperature coercivity and a switching temperature coercivity. The switching temperature coercivity is not more than one-half of the room temperature coercivity.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
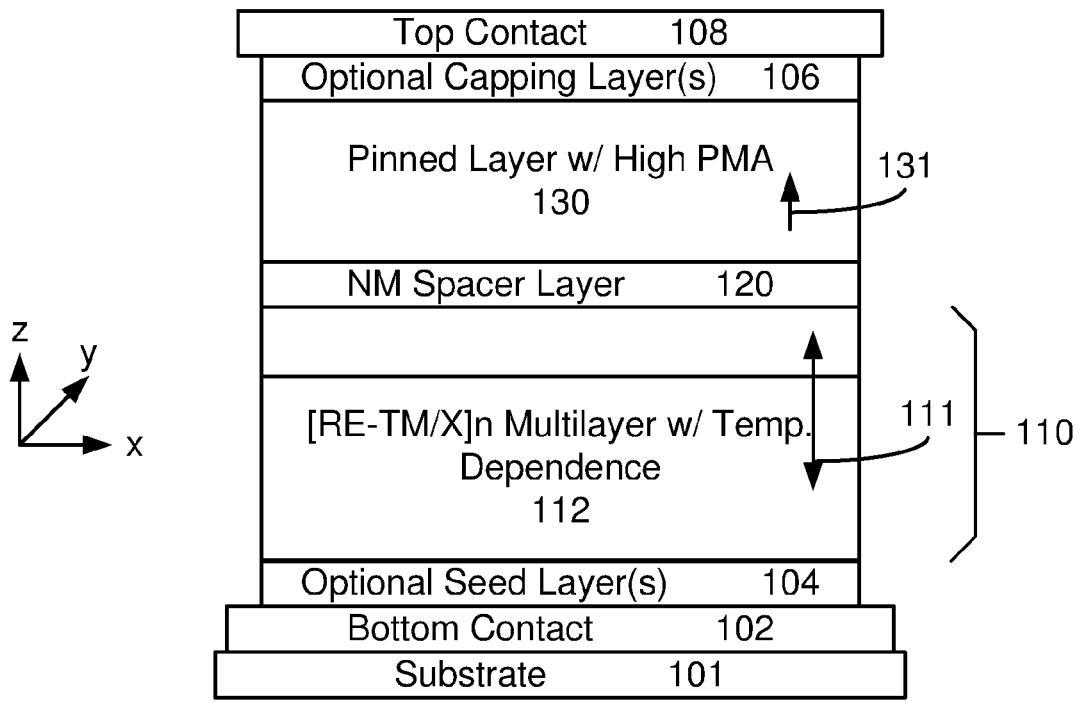
FIG. 2 depicts an exemplary embodiment of a magnetic junction including a high perpendicular magnetic anisotropy and thermally sensitive free layer usable in a magnetic memory programmable using spin transfer torque.

FIG. 2 depicts an exemplary embodiment of a magnetic junction 100 including a free layer that has a high perpendicular magnetic anisotropy and is thermally sensitive. The magnetic junction 100 is usable in a magnetic memory programmable using spin transfer torque. For clarity, FIG. 2 is not to scale. The magnetic junction 100 may be used in a magnetic device such as a STT-RAM and, therefore, in a variety of electronic devices. The magnetic junction 100 includes a free layer 110 having magnetic moment 111, a nonmagnetic spacer layer 120, and a pinned layer 130 having magnetic moment 131. Also shown is an underlying substrate 101 in which devices including but not limited to a transistor may be formed. Bottom contact 102, top contact 108, optional seed layer(s) 104 and optional capping layer(s) 106 are also shown. For example, the seed layer(s) 104 may include a thin MgO seed layer. As can be seen in FIG. 2, the pinned layer 130 is closer to the top (furthest from a substrate 101) of the magnetic junction 100 than the free layer 110 is. The pinned layer 130 is also deposited after the free layer 110. The magnetic junction 100 is, therefore, a top pinned junction. In alternate embodiments, the magnetic junction 100 could be a dual magnetic junction or a bottom pinned junction. For a dual magnetic junction, at least an additional (bottom) nonmagnetic spacer layer (not shown in FIG. 2) and an additional (bottom) pinned layer (not shown in FIG. 2) would be present between the free layer 110 and the optional seed layer(s) 104/bottom contact 102. An optional pinning layer (not shown) may be used to fix the magnetization (not shown) of the pinned layer 130. In some embodiments, the optional pinning layer may be an AFM layer or multilayer that pins the magnetization (not shown) of the pinned layer 130 by an exchange-bias interaction. However, in other embodiments, the optional pinning layer may be omitted or another structure may be used. Other layers including but not limited to polarization enhancement layers (PELs) having a high spin polarization, magnetic or nonmagnetic insertion layers, and/or other layers may be included in the layers of the magnetic junction 100 or be considered to be separate layers that may be used in the magnetic junction 100. However, such layers are not shown for simplicity.

The nonmagnetic spacer layer 120 may be an MgO tunneling barrier layer. The MgO layer may be crystalline and have a 200 orientation for enhanced tunneling magnetoresistance (TMR). In other embodiments, the nonmagnetic spacer layer may be a different tunneling barrier layer, may be a conductive layer or may have another structure.

The pinned layer 130 is magnetic. The pinned layer 130 may be part of a pinned structure, such as a SAF. In such embodiments, the pinned layer 130 would be one of the ferromagnetic layers interleaved with nonmagnetic layer(s). The pinned layer 130 may be a multilayer. Thus, the pinned layer 130 layer may also include sublayers including but not limited to multiple ferromagnetic layers. A polarization enhancement layer (PEL) having a high spin polarization may be provided at the portion of the pinned layer 130 nearest to the magnetic spacer layer 120. The perpendicular magnetic anisotropy energy of the pinned layer 130 exceeds its out-of-plane demagnetization energy. The pinned layer 130 has a high perpendicular magnetic anisotropy (PMA). As used herein a high PMA is a PMA such that the PMA energy is greater than the out-of-plane demagnetization energy. Because the pinned layer 130 has a high PMA, the magnetic moment 131 of the pinned layer 130 may be perpendicular-to-plane. In such embodiments, a pinning layer is generally not used. For example, the pinned layer 130 may include a multilayer including multiple repeats of a Co/Pt bilayer, a CoPt alloy, a CoTb alloy and/or multiple repeats of a Co/Tb bilayer. Such combinations may have a high PMA. Similarly, the pinned layer 130 may include one or more of CoFeB, FeB, CoB, Fe, $Co_2FeAl$, $Co_2FeAlSi$, $Co_2MnSi$ and MnAl, which may have a high PMA. Note that as used herein CoFeB, FeB, CoB and MnAl denote alloys in which the stoichiometry is not indicated. For example, CoFeB may include $(CoFe)_{1-x}B_x$, where x is greater than or equal to zero and less than or equal to 0.5. For example, x may be at least 0.2 and not more than 0.4. Similarly, FeB may be $Fe_{1-x}B_x$, where x is greater than or equal to zero and less than or equal to 0.5. Other materials and/or structures are having a high PMA possible for the pinned layer 130.

The free layer 110 is magnetic and has a perpendicular magnetic anisotropy energy that exceeds the out-of-plane demagnetization energy. The free layer thus has a high PMA. The magnetic moment 111 of the free layer 110 may thus be oriented perpendicular-to-plane as shown in FIG. 2. The magnetic junction is also configured such that the magnetic moment 111 of the free layer 110 may be switched using a write current driven through the magnetic junction (e.g. using spin transfer).

Although the free layer 110 may be metallic, the write current passing through the magnetic junction 100 causes joule heating in the free layer 110. Consequently, the free layer 110 has a higher temperature during switching than when the free layer is quiescent or being read. Thus, the switching temperature of the free layer 110 is greater than room temperature. In some embodiments, the switching temperature of the free layer 110 is at least one hundred degrees Celsius and not more than two hundred degrees Celsius. In some such embodiments, the switching temperature for the free layer 110 is at least one hundred and thirty degrees Celsius and not more than one hundred and eighty degrees Celsius. For example, the switching temperature of the free layer may be on the order of one hundred and fifty degrees Celsius. The switching temperature of the free layer 110 is, however, generally desired to be less than any of the anneal temperatures used during fabrication of the magnetic junction 100, described below.

The free layer 110 includes a multilayer 112 that is temperature sensitive. The multilayer 112 includes at least one bilayer. The first layer of the bilayer is an alloy of a rare earth (RE) and a magnetic transition metal (TM). This alloy may be termed a RE-TM alloy. The second layer is a magnetic layer (denoted as X in FIG. 2). In some embodiments, the magnetic layer is amorphous as-deposited. As used herein, an amorphous magnetic layer is amorphous as-deposited, but may be partially or fully crystallized during fabrication particularly if B is allowed to diffuse from the amorphous magnetic layer. For example, the amorphous magnetic layer may be an FeB layer. The amorphous magnetic layer may be a magnetic transition metal alloy layer. Thus, the multilayer 112 includes layer(s) of an RE-TM alloy layer interleaved with amorphous magnetic alloy layer(s). For example, the multilayer 112 may include layers of CoTb (the RE-TM layer) interleaved with layers of FeB or CoFeB (the amorphous magnetic alloy layer). The [RE-TM/X]n multilayer depicted in FIG. 2 may include n repeats of a CoTb/FeB bilayer, where n is an integer greater than or equal to one. In some embodiments, n does not exceed seven. The CoTb may be $Co_xTb_{1-x}$, where x is 0.4-0.5 in some embodiments. The FeB layer may have Fe: 80-60 atomic percent and B: 20-40 atomic percent. In some cases, there may be a gradient in the stoichiometry of the RE-TM alloy layer and/or the amorphous magnetic alloy may vary throughout the multilayer 112. For example, the RE-TM alloy layer may vary from forty atomic percent Co for the first bilayer to fifty atomic percent Co for the $n^{th}$ repeat of the bilayer. In such embodiments, the stoichiometry of the amorphous magnetic alloy may be substantially constant or may vary. Similarly, the amorphous magnetic alloy may have a stoichiometry that varies throughout the multilayer 112. In such embodiments, the stoichiometry of the RE-TM alloy may be substantially constant or may vary. The thicknesses of the CoTb and/or FeB layer may also vary throughout the multilayer 112.

The layers of the bilayer may also be thin. For example, the amorphous magnetic alloy layers may be at least two Angstroms and not more than five Angstroms thick. The RE-TM alloy layer may have the same thickness as or a different thickness from the amorphous magnetic alloy layers. In addition, there may be a gradient in thickness of the RE-TM alloy layers and/or the amorphous magnetic alloy layers in the multilayer. For example, the multilayer might include n repeats of a bilayer including nominally three Angstroms of CoTb and nominally 4 Angstroms of FeB. In such an embodiment, the thicknesses of the RE-TM alloy (e.g. CoTb) layer and the amorphous magnetic alloy (FeB) layer do not vary. In other embodiments, the thickness of the CoTb layer and/or the FeB or CoFeB layer may vary over repeats of the bilayer. For example, three repeats of the bilayer may include three, four and five Angstroms of CoTb in the first, second and third repeats of the bilayer. These thickness variations and/or the stoichiometry variations may be configured to provide the desired temperature dependence of the magnetic properties of the multilayer 112.

In addition to the RE-TM alloy and amorphous magnetic alloy bilayers, the free layer 110 may include other layers. For example, the multilayer may include interfacial layer(s), coupling layer(s) and/or insertion layer(s). The free layer 110 may include a polarization enhancement layer (PEL) in addition to a multilayer. The PEL may include materials such as CoFeB or FeB and may have the stoichiometries described above. In some embodiments the free layer 110 may include RE blocking layer(s). For example, where the RE-TM layer includes Tb, a Tb blocking layer may be used. The Tb blocking layer aids in preventing or reducing the diffusion of Tb through the free layer 110. Such a Tb blocking layer may include Mg. The free layer further includes an additional multilayer including a CoFeB layer, a W layer, another CoFeB layer and a Fe layer, where the CoFeB may have the stoichiometries discussed above. In such an embodiment, the W layer may be an insertion layer used to attract B during fabrication of the magnetic junction 100.

The room temperature coercivity of the multilayer 112 is greater than the switching temperature coercivity of the multilayer 112. The switching temperature coercivity is not more than one-half of the room temperature coercivity. In some such embodiments, the switching temperature coercivity of the multilayer is not more than one-fourth of the room temperature coercivity multilayer. Because the magnetic properties of the multilayer 12 are temperature dependent, the properties of the free layer 110 also depend upon temperature. For example, the coercivity of the free layer 110 may be significantly reduced during switching due to the reduction in coercivity of the multilayer.

The magnetic junction 100 may have improved performance. The free layer 110 and pinned layer 130 may have their magnetic moments oriented perpendicular-to-plane, which may be desirable for improved performance. This orientation may be due to the RE-TM alloy and amorphous magnetic alloy bilayer(s). Switching of the free layer 110 may also be accomplished at a lower current. The multilayer 112 is configured such that the coercivity has a strong temperature dependence. The PMA of the multilayer 112 has an analogous strong temperature dependence. Because of the reduction in coercivity and PMA at the switching temperature, a lower write current may be used to switch the magnetic moment 111 of the free layer 110. The magnetic junction 100 may be more rapidly and easily programmed. In addition, other layers in the free layer 110 may be used to maintain the TMR and, therefore, the read signal. Consequently, performance of the magnetic junction 100 may be improved.

Figure 3:
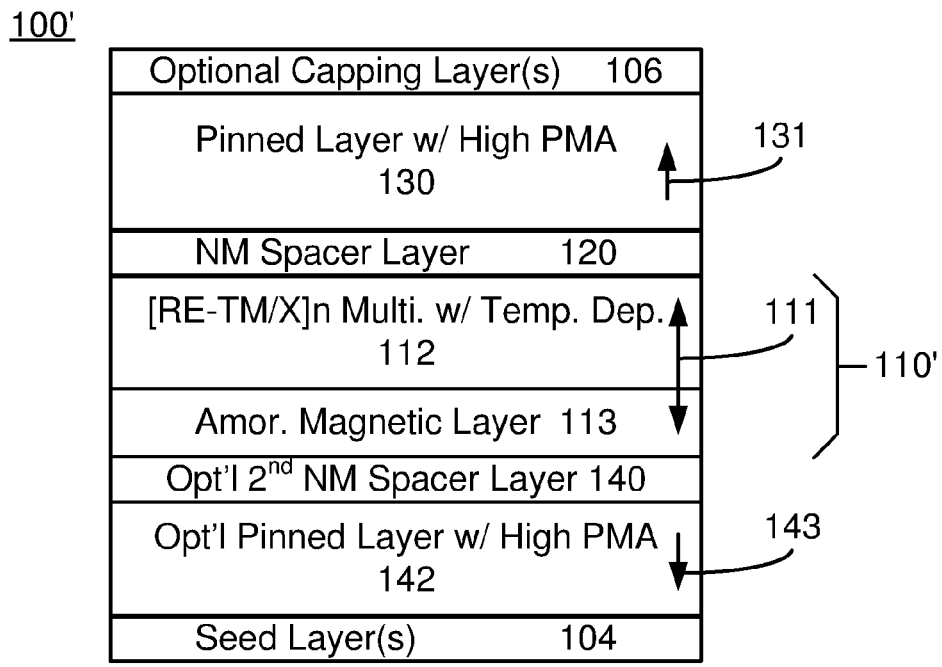
FIG. 3 depicts another exemplary embodiment of a magnetic junction including a high perpendicular magnetic anisotropy and thermally sensitive free layer usable in a magnetic memory programmable using spin transfer torque.

FIG. 3 depicts another exemplary embodiment of a magnetic junction 100' including a free layer that has a high perpendicular magnetic anisotropy and is thermally sensitive. For clarity, FIG. 3 is not to scale. The magnetic junction 100' may be used in a magnetic device such as a STT-RAM and, therefore, in a variety of electronic devices. The magnetic junction 100' is analogous to the magnetic junction 100. Consequently, similar components have analogous labels. The magnetic junction 100' includes a free layer 110' having magnetic moment 111, a nonmagnetic spacer layer 120, and a pinned layer 130 having magnetic moment 131 that are analogous to the free layer 110 having magnetic moment 111, the nonmagnetic spacer layer 120, and the pinned layer 130 having magnetic moment 131, respectively, depicted in the magnetic junction 100. Also shown are optional seed layer(s) 102 and capping layer(s) 106 that are analogous to the capping layers 104 and 106, respectively. Although not shown, an underlying substrate, bottom contact and top contact that may be analogous to the substrate 101, bottom contact 102 and top contact 108 for the magnetic junction 100.

The free layer 110' shown in FIG. 3 includes a multilayer 112 that is analogous to the multilayer 112 depicted in FIG. 2. Thus, the multilayer 112 includes one or more repeats of a bilayer. The bilayer includes RE-TM alloy layers interleaved with magnetic alloys layers. For example, the bilayer may be a CoTb/FeB bilayer as described above. The multilayer 112 is thus temperature sensitive. In particular, the coercivity and, therefore, PMA may increase during switching due to joule heating of the free layer 110'. The coercivity at the switching temperature may be not more than one-half of the coercivity of the multilayer 112 at room temperature. In some embodiments, the coercivity of the multilayer 112 at the switching temperature may be not more than one fourth the room temperature coercivity. The PMA and coercivity of the free layer 110' as a whole are reduced in a similar manner. The switching temperature of the free layer 110' may be analogous to that of the free layer 110 described above.

The free layer 110' also includes an additional amorphous magnetic layer 113. The amorphous magnetic layer 113 may be a CoFeB layer. As discussed above, the amorphous magnetic layer 113 is amorphous as deposited, but may be partially or fully crystallized during fabrication. The CoFeB layer 113 may have a PMA and improved TMR. Thus, the magnetic moment 111 of the free layer 110' may remain perpendicular-to-plane.

In the embodiment shown, the magnetic junction 100' may be a dual magnetic junction. Thus, an additional nonmagnetic spacer layer 140 and an additional pinned layer 142 having a high PMA may be included in the magnetic junction 100'. The additional nonmagnetic spacer layer 142 may be analogous to the nonmagnetic spacer layer 120. For example, the additional nonmagnetic spacer layer 142 may be a tunneling barrier layer. The additional pinned layer 142 has a high PMA and, therefore, a magnetic moment 143 that is substantially perpendicular-to-plane. In the embodiment shown, the magnetic moment 143 is opposite to the magnetic moment. Thus, the magnetic junction 100' is in a dual state. In other embodiments, the magnetic moments 131 and 143 may be aligned. Alternatively, the layers 140 and 142 may be omitted. In such an embodiments, the magnetic junction 100' is a top pinned magnetic junction.

The magnetic junction 100' may share the benefits of the magnetic junction 100. For example, the free layer 110 and pinned layer 130 may have their magnetic moments oriented perpendicular-to-plane. Switching of the free layer 110' may also be accomplished at a lower current. The magnetic junction 100' may be more rapidly and easily programmed due to the multilayer 112. In addition, other layers such as the amorphous layer 113 in the free layer 110' may be used to maintain the TMR and, therefore, the read signal. Consequently, performance of the magnetic junction 100' may be improved.

Figure 4:
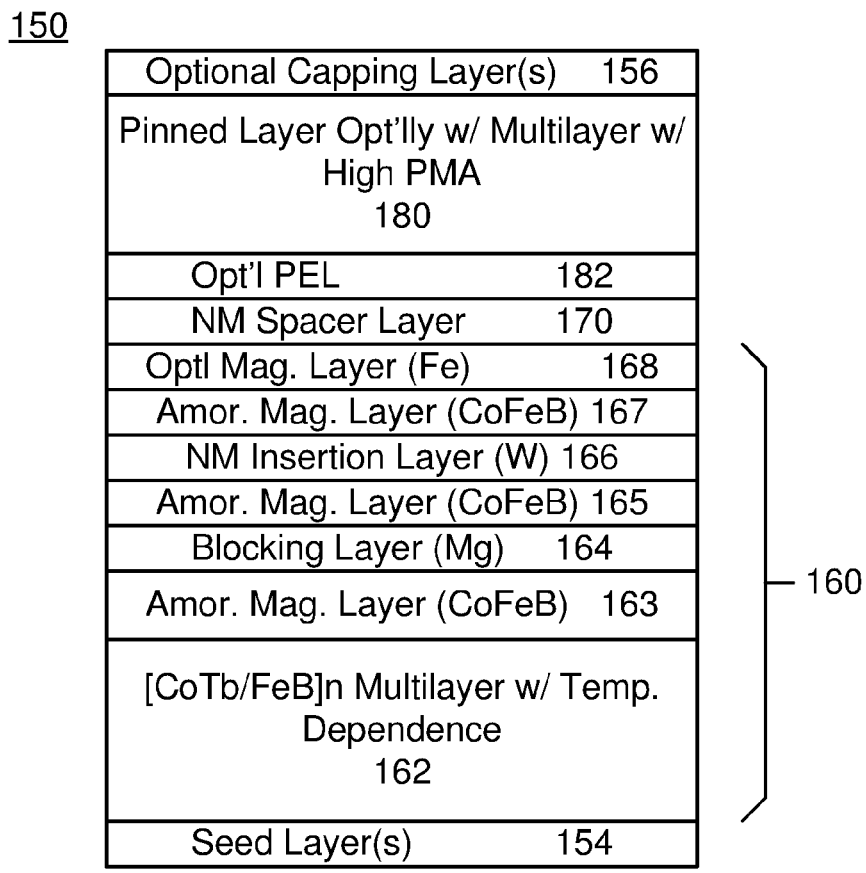
FIG. 4 depicts another exemplary embodiment of a magnetic junction including a high perpendicular magnetic anisotropy and thermally sensitive free layer usable in a magnetic memory programmable using spin transfer torque.

FIG. 4 depicts another exemplary embodiment of a magnetic junction 150 including a free layer that has a high perpendicular magnetic anisotropy and is thermally sensitive. For clarity, FIG. 4 is not to scale. The magnetic junction 150 may be used in a magnetic device such as a STT-RAM and, therefore, in a variety of electronic devices. The magnetic junction 150 is analogous to the magnetic junction(s) 100 and/or 100'. Consequently, similar components have analogous labels. The magnetic junction 150 includes a free layer 160 having a perpendicular-to-plane magnetic moment (not shown), a nonmagnetic spacer layer 170, an optional PEL 182 and a pinned layer 180 having a perpendicular-to-plane magnetic moment (not explicitly depicted) that are analogous to the free layer 110/110' having magnetic moment 111, the nonmagnetic spacer layer 120, and the pinned layer 130 having magnetic moment 131, respectively, depicted in the magnetic junction 100/100'. Also shown are optional seed layer(s) 152 and capping layer(s) 156 that are analogous to the capping layers 104 and 106, respectively. Although not shown, an underlying substrate, bottom contact and top contact may be analogous to the substrate 101, bottom contact 102 and top contact 108, respectively, for the magnetic junction 100/100'. In addition, the magnetic junction 150 could be a dual magnetic junction if an additional nonmagnetic spacer layer and an additional pinned layer analogous to the layers 140 and 142, respectively, are included. The PEL 182 is magnetically coupled to the pinned layer 180 and may be considered to be part of the pinned layer 180. The PEL 182 may, for example, include an Fe or other layer having a high spin polarization.

The magnetic junction 150 is a top pinned magnetic junction. In particular, the pinned layer 180 is further from the substrate (not shown) than the free layer 160. Thus, the seed layer(s) 104 depicted in FIG. 4 might be the same as or different from the seed layer(s) of FIGS. 2-3.

The free layer 160 shown in FIG. 4 includes a multilayer 162 that is analogous to the multilayer 112 depicted in FIGS. 2-3. Thus, the multilayer 162 includes one or more repeats of a bilayer. The bilayer includes RE-TM/magnetic alloy layers interleaved with magnetic alloys. For example, the bilayer may be a CoTb/FeB bilayer as described above. The multilayer 162 is temperature sensitive. The coercivity and, therefore, the PMA of the multilayer 162 may decrease during switching due to joule heating of the free layer 160. The coercivity at the switching temperature may be not more than one-half of the coercivity of the multilayer 162 at room temperature. In some embodiments, the coercivity of the multilayer 162 at the switching temperature may be not more than one fourth the room temperature coercivity. The switching temperature of the free layer 160 may be on the order of the switching temperature of the free layers 110 and/or 110'. The PMA and coercivity of the free layer 160 as a whole are reduced in a similar manner.

The free layer 160 includes an additional amorphous magnetic layer 163 analogous to the layer 113. The amorphous magnetic layer 163 may be a CoFeB layer having the stoichiometry discussed above. Such a CoFeB layer 163 may have a PMA and improved TMR. Thus, the magnetic moment of the free layer 160 may remain perpendicular-to-plane.

Also shown are a blocking layer 164 and an additional multilayer including amorphous magnetic layers 165 and 167 separated by a nonmagnetic insertion layer 166 and an additional magnetic layer 168. The blocking layer 164 may be nonmagnetic and is used to block the diffusion of the RE from the multilayer 162 during fabrication. For example, an Mg blocking layer 164 may be used to block the diffusion of Tb through the magnetic junction. Without the presence of the Mg blocking layer 164, Tb may diffuse through the magnetic junction, which reduces the spin polarization. Thus, switching may be adversely affected. The amorphous magnetic layers 165 and 167 have a high PMA and may improve magnetoresistance. For example, CoFeB in the stoichiometries discussed above might be used for one or both of the amorphous magnetic layers 165 and 167. As discussed above, an amorphous magnetic layer is amorphous as deposited, but may be partially or fully crystallized during fabrication. Nonmagnetic insertion layer 166 may be used as a sink for B during fabrication. The nonmagnetic insertion layer 166 may improve the properties of the amorphous magnetic layers 165 and 167, allowing for improved spin transfer based switching and magnetoresistance. The optional magnetic layer 168 may, for example, include an Fe layer. The optional magnetic layer 168 may be viewed as a PEL.

The magnetic junction 150 may share the benefits of the magnetic junction(s) 100 and/or 100'. For example, the free layer 160 and pinned layer 180 may have their magnetic moments oriented perpendicular-to-plane. Switching of the free layer 160 may also be accomplished at a lower current. The magnetic junction 160 may be more rapidly and easily programmed due to the temperature dependence of the magnetic properties of the multilayer 162. In addition, other layers such as the amorphous layer 163, blocking layer 164 and layers 165, 166 and 167 in the free layer 160 may be used to maintain the TMR and/or spin transfer based switching. Thus, the read signal may be enhanced while the write current may be reduced. Consequently, performance of the magnetic junction 150 may be improved.

Figure 5:
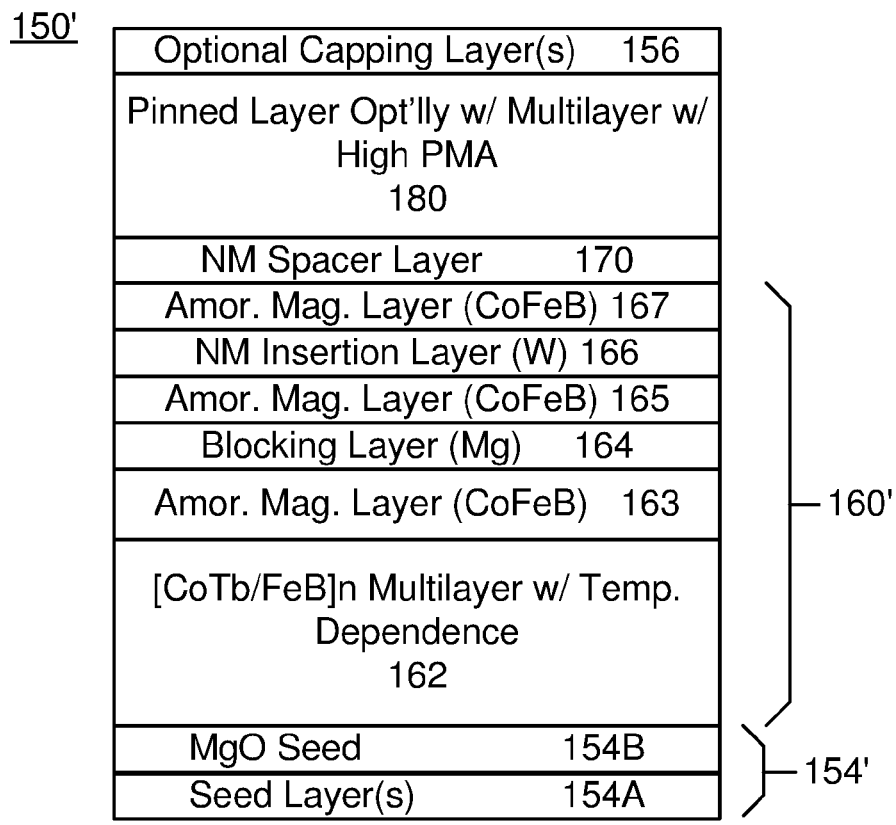
FIG. 5 depicts another exemplary embodiment of a magnetic junction including a high perpendicular magnetic anisotropy and thermally sensitive free layer usable in a magnetic memory programmable using spin transfer torque.

FIG. 5 depicts another exemplary embodiment of a magnetic junction 150' including a free layer that has a high perpendicular magnetic anisotropy and is thermally sensitive. For clarity, FIG. 5 is not to scale. The magnetic junction 150' may be used in a magnetic device such as a STT-RAM and, therefore, in a variety of electronic devices. The magnetic junction 150' is analogous to the magnetic junction(s) 100, 100' and/or 150. Consequently, similar components have analogous labels. The magnetic junction 150' includes a free layer 160' having a perpendicular-to-plane magnetic moment (not shown), a nonmagnetic spacer layer 170 and a pinned layer 180 having a perpendicular-to-plane magnetic moment (not explicitly depicted) that are analogous to the free layer 110/110'/160 having magnetic moment 111, the nonmagnetic spacer layer 120/170, and the pinned layer 130/180 having magnetic moment 131, respectively, depicted in the magnetic junction 100/100'/150. Also shown are optional seed layer(s) 152 and capping layer(s) 156 that are analogous to the capping layers 104 and 106, respectively. Although not shown, an underlying substrate, bottom contact and top contact may be analogous to the substrate 101, bottom contact 102 and top contact 108, respectively, for the magnetic junction 100/100'. In addition, the magnetic junction 150 could be a dual magnetic junction if an additional nonmagnetic spacer layer and an additional pinned layer analogous to the layers 140 and 142, respectively, are included. The magnetic junction 150 is a top pinned magnetic junction. In particular, the pinned layer 180 is further from the substrate (not shown) than the free layer 160'.

The free layer 160' shown in FIG. 5 includes a multilayer 162 that is analogous to the multilayer 112/162 depicted in FIGS. 2-4. Thus, the multilayer 162 includes one or more repeats of a bilayer. The bilayer includes RE-TM/magnetic alloy layers interleaved with magnetic alloys. For example, the bilayer may be a CoTb/FeB bilayer as described above.

The multilayer 162 is temperature sensitive. The coercivity and, therefore, the PMA of the multilayer 162 may decrease during switching due to joule heating of the free layer 160'. The coercivity at the switching temperature may be not more than one-half of the coercivity of the multilayer 162 at room temperature. In some embodiments, the coercivity of the multilayer 162 at the switching temperature may be not more than one fourth the room temperature coercivity. The PMA and coercivity of the free layer 160 as a whole are reduced in a similar manner.

In addition, the free layer 160' includes an additional amorphous magnetic layer 163, blocking layer 164, amorphous magnetic layer 165, nonmagnetic insertion layer 166 and amorphous magnetic layer 167 that are analogous to the layers 113/163, 164, 165, 166, and 167, respectively.

Further, the seed layers 154' include MgO seed layer 154B and optional metallic seed layer(s) 154A. The MgO seed layer 154B may result in a higher TMR for the free layer 160'.

The magnetic junction 150' may share the benefits of the magnetic junction(s) 100, 100' and/or 150. For example, the free layer 160' and pinned layer 180 may have their magnetic moments oriented perpendicular-to-plane. Switching of the free layer 160' may also be accomplished at a lower current. The magnetic junction 150' may be more rapidly and easily programmed due to the temperature dependence of the magnetic properties of the multilayer 162. In addition, other layers such as the seed layer 104', amorphous layer 163, blocking layer 164 and layers 165, 166 and 167 in the free layer 160' may be used to maintain or improve the TMR and/or spin transfer based switching. Thus, the read signal may be enhanced while the write current may be reduced. Consequently, performance of the magnetic junction 150' may be improved.

Figure 6:
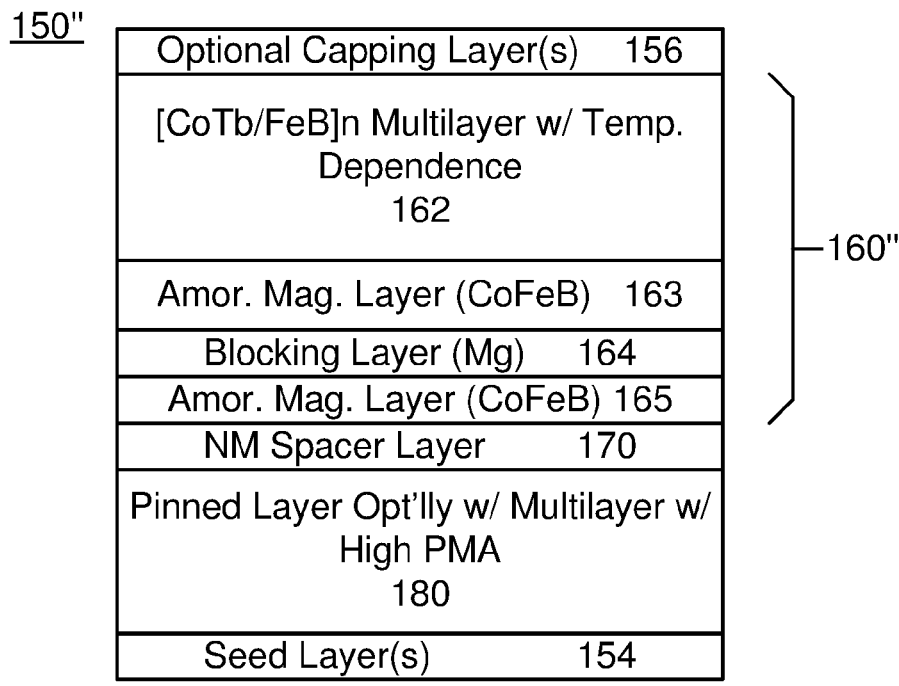
FIG. 6 depicts another exemplary embodiment of a magnetic junction including a high perpendicular magnetic anisotropy and thermally sensitive free layer usable in a magnetic memory programmable using spin transfer torque.

FIG. 6 depicts another exemplary embodiment of a magnetic junction 150" including a free layer that has a high perpendicular magnetic anisotropy and is thermally sensitive. For clarity, FIG. 6 is not to scale. The magnetic junction 150" may be used in a magnetic device such as a STT-RAM and, therefore, in a variety of electronic devices. The magnetic junction 150" is analogous to the magnetic junction(s) 100, 100', 150 and/or 150'. Consequently, similar components have analogous labels. The magnetic junction 150" includes a free layer 160" having a perpendicular-to-plane magnetic moment (not shown), a nonmagnetic spacer layer 170 and a pinned layer 180 having a perpendicular-to-plane magnetic moment (not explicitly depicted) that are analogous to the free layer 110/110'/160/160' having magnetic moment 111, the nonmagnetic spacer layer 120/170, and the pinned layer 130/180 having magnetic moment 131, respectively, depicted in the magnetic junction 100/100'/150. Also shown are optional seed layer(s) 152 and capping layer(s) 156 that are analogous to the capping layers 104 and 106, respectively. Although not shown, an underlying substrate, bottom contact and top contact may be analogous to the substrate 101, bottom contact 102 and top contact 108, respectively, for the magnetic junction 100/100'. In addition, the magnetic junction 150 could be a dual magnetic junction if an additional nonmagnetic spacer layer and an additional pinned layer analogous to the layers 140 and 142, respectively, are included. The magnetic junction 150 is a bottom pinned magnetic junction. In particular, the pinned layer 180 is closer to the substrate (not shown) than the free layer 160'.

The free layer 160" shown in FIG. 6 includes a multilayer 162 that is analogous to the multilayer 112/162 depicted in FIGS. 2-5. Thus, the multilayer 162 includes one or more repeats of a bilayer. The bilayer includes RE-TM/magnetic alloy layers interleaved with magnetic alloys. For example, the bilayer may be a CoTb/FeB bilayer as described above. The multilayer 162 is temperature sensitive. The coercivity and, therefore, the PMA of the multilayer 162 may increase during switching due to joule heating of the free layer 160". The coercivity at the switching temperature may be not more than one-half of the coercivity of the multilayer 162 at room temperature. In some embodiments, the coercivity of the multilayer 162 at the switching temperature may be not more than one fourth the room temperature coercivity. The PMA and coercivity of the free layer 160 as a whole are reduced in a similar manner.

In addition, the free layer 160 includes an additional amorphous magnetic layer 163, blocking layer 164 and amorphous magnetic layer 165 that are analogous to the layers 113/163, 164 and 165, respectively. Note that the layers 166 and 167 have been omitted in this embodiment.

The magnetic junction 150" may share the benefits of the magnetic junction(s) 100, 100', 150 and/or 150'. For example, the free layer 160" and pinned layer 180 may have their magnetic moments oriented perpendicular-to-plane. Switching of the free layer 160" may also be accomplished at a lower current. The magnetic junction 150" may be more rapidly and easily programmed due to the temperature dependence of the magnetic properties of the multilayer 162. In addition, other layers such as the seed layer 154, amorphous layer 163, blocking layer 164 and amorphous magnetic layer 165 in the free layer 160" may be used to maintain or improve the TMR and/or spin transfer based switching. Thus, the read signal may be enhanced while the write current may be reduced. Consequently, performance of the magnetic junction 150" may be improved.

Various magnetic junctions 100, 100', 150, 150' and 150" having various features have been described. Characteristics of the magnetic junctions 100, 100', 150, 150' and 150" may be combined in magnetic junction(s) in manners not explicitly described herein. Thus, magnetic junctions possessing one or more of the features and benefits of the magnetic junctions 100, 100', 150, 150' and 150" may be provided.

Figure 7:
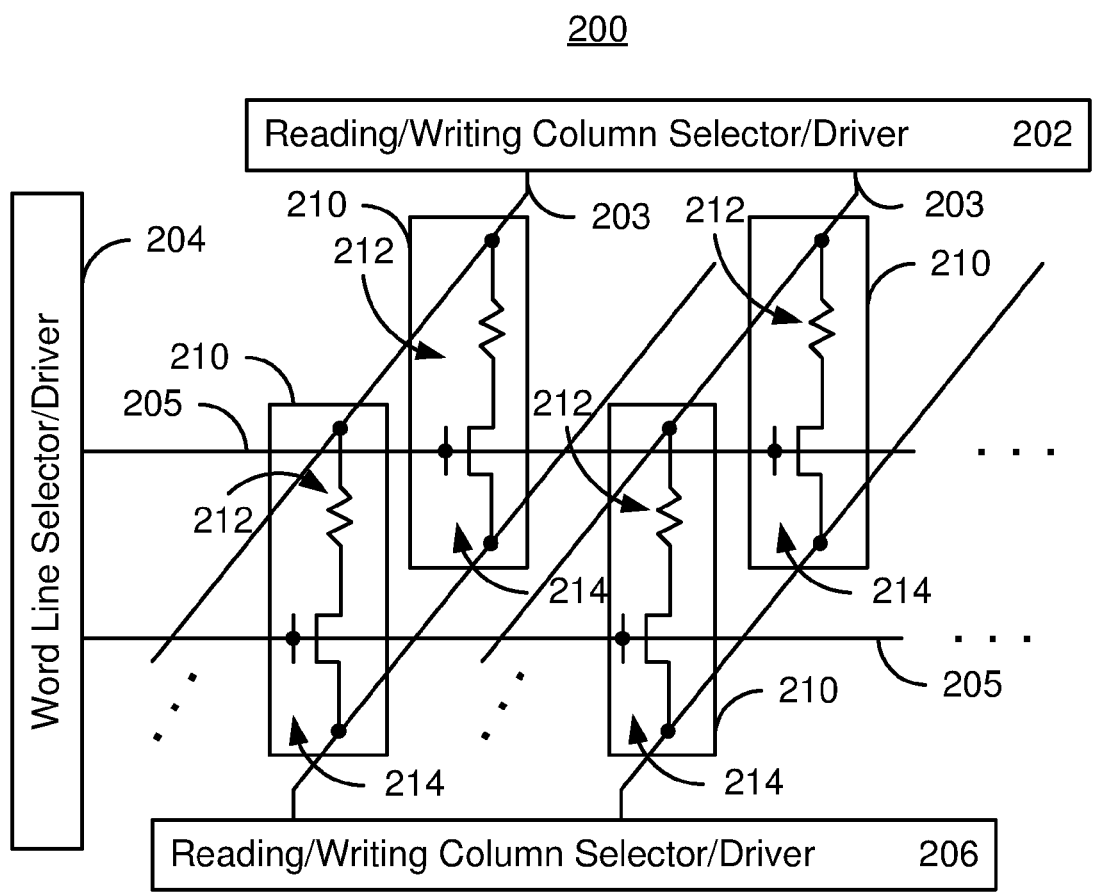
FIG. 7 depicts an exemplary embodiment of a memory utilizing magnetic junctions including a high perpendicular magnetic anisotropy and thermally sensitive free layer usable in a magnetic memory programmable using spin transfer torque in the memory element(s) of the storage cell(s).

FIG. 7 depicts an exemplary embodiment of a memory 200 that may use one or more of the magnetic junctions magnetic junctions 100, 100', 150, 150' and 150". The magnetic memory 200 includes reading/writing column select drivers 202 and 206 as well as word line select driver 204. Note that other and/or different components may be provided. The storage region of the memory 200 includes magnetic storage cells 210. Each magnetic storage cell includes at least one magnetic junction 212 and at least one selection device 214. In some embodiments, the selection device 214 is a transistor. The magnetic junctions 212 may be one of the magnetic junctions magnetic junctions 100, 100', 150, 150' and/or 150" described herein. Although one magnetic junction 212 is shown per cell 210, in other embodiments, another number of magnetic junctions 212 may be provided per cell. As such, the magnetic memory 200 may enjoy the benefits described above.

Figure 8:
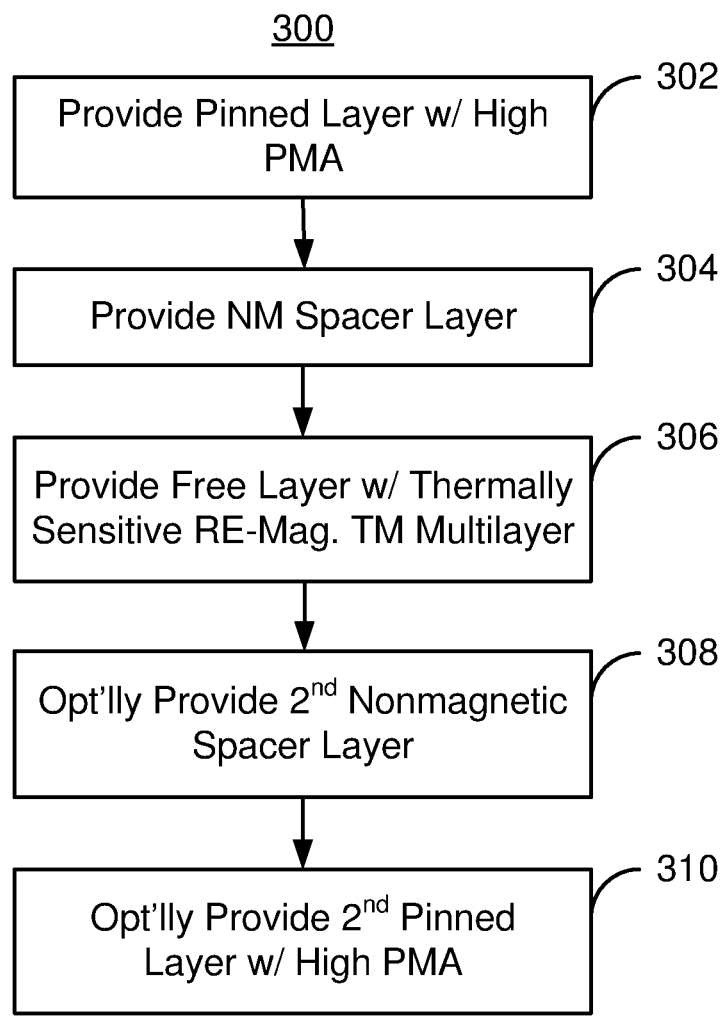
FIG. 8 is a flow chart depicting an exemplary embodiment of a method for providing a magnetic junction including a high perpendicular magnetic anisotropy and thermally sensitive free layer usable in a magnetic memory programmable using spin transfer torque.

FIG. 8 is a flow chart depicting an exemplary embodiment of a method 300 for providing a magnetic junction including a high perpendicular magnetic anisotropy and thermally sensitive free layer usable in a magnetic memory programmable using spin transfer torque, such as a STT-RAM and, therefore, in a variety of electronic devices. For simplicity, some steps may be omitted, performed in another order, include substeps and/or combined. Further, the method 300 may start after other steps in forming a magnetic memory have been performed. For simplicity, the method 300 is described in the context of the magnetic junctions 100, 110' and 150". However, other magnetic junctions may be formed.

A pinned layer 130/180 is provided, via step 302. The pinned layer provided in step 302 has a high perpendicular magnetic anisotropy and may include a multilayer. In some embodiments, the bottom pinned layer includes multiple repeats of a RE-TM layer and an amorphous magnetic layer. Insertion and/or interfacial layers may also be present. However, such a RE-TM/amorphous magnetic layer multilayer would be configured to be magnetically stable at the switching temperature. Stated differently, the magnetic properties of such a pinned layer are generally less sensitive than those of the free layer 110/160". Alternatively, another pinned layer might be provided. For example, multiple repeats of a Co/Pt bilayer may be deposited in step 602. Step 302 may also include providing a PEL, such as the PEL 182 of FIG. 4. Thus, step 302 may include depositing multiple layers.

The nonmagnetic spacer layer, such as the layer 120 or 170 is provided, via step 304. Step 304 may include depositing an MgO layer and/or depositing and oxidizing an Mg layer. A tunneling barrier layer may thus be provided. In other embodiments, another nonmagnetic spacer layer may be used. Step 304 is performed after step 302 if a bottom pinned layer magnetic junction, such as the magnetic junction 150", is being fabricated. If a top pinned layer magnetic junction such as the magnetic junction 100, is being fabricated, then step 302 is performed after step 304.

The free layer, such as the free layer 110/110'/160", is provided, via step 306. If steps 302 and 304 were performed before step 306, then the magnetic junction being fabricated may be a bottom pinned or dual magnetic junction. Alternatively, step 306 is performed before steps 302 and 304 is a top pinned magnetic junction is being formed. The free layer provided in step 306 includes a thermally sensitive multilayer such as the multilayer 112 and/or 162. One or more of blocking layer(s), amorphous magnetic layer(s) and sink layer(s) may also be present. The free layer has a high perpendicular magnetic anisotropy. Thus, the free layer formed in step 306 has a perpendicular-to-plane magnetic moment.

A nonmagnetic spacer, such as the layer 140 may optionally be provided, via step 308. Step 308 may include depositing an MgO layer and/or depositing and oxidizing an Mg layer. A tunneling barrier layer may thus be provided. In other embodiments, another nonmagnetic spacer layer may be used. Step 308 is performed if the magnetic junction being formed is a dual magnetic junction.

A pinned layer may optionally be provided, via step 310. The pinned layer may be the layer 142 in the magnetic junction 100'. Step 310 is thus analogous to step 302.

Although steps 302, 304, 306, 308 and 310 are described as providing specific layers, the edges of each layer is typically not defined until the entire stack has been deposited. The edges of the pinned layer(s), nonmagnetic spacer layer(s) and free layer may be defined at a different time than these layers are deposited. Thus, the steps 302, 304, 306, 308 and 310 may be spread out in time. However, in an alternate embodiment, one or more of the steps 302, 304, 306, 308 and 310 may include not only depositing the layer but also immediately defining the edges of the layer.

Using the method 300, the magnetic junction 100, 100', 150, 150' and/or 150" may be formed. Thus, the benefits of the magnetic junction(s) 100, 100', 150, 150' and/or 150" using one or more of the multilayers 112 and 162 may be achieved.

Figure 9:
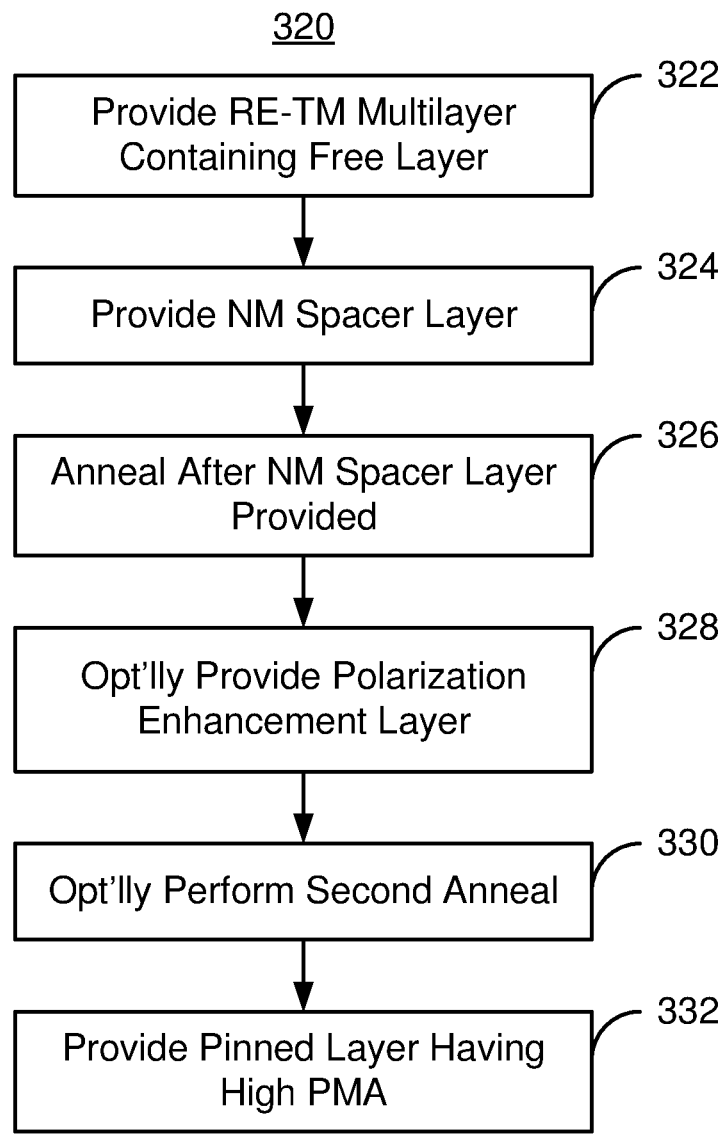
FIG. 9 is a flow chart depicting another exemplary embodiment of a method for providing a magnetic junction including a high perpendicular magnetic anisotropy and thermally sensitive free layer usable in a magnetic memory programmable using spin transfer torque.

FIG. 9 is a flow chart depicting an exemplary embodiment of a method 320 for providing a magnetic junction including a high perpendicular magnetic anisotropy and thermally sensitive free layer usable in a magnetic memory programmable using spin transfer torque, such as a STT-RAM and, therefore, in a variety of electronic devices. For simplicity, some steps may be omitted, performed in another order, include substeps and/or combined. Further, the method 320 may start after other steps in forming a magnetic memory have been performed. For simplicity, the method 320 is described in the context of the magnetic junctions 150. However, other magnetic junctions may be formed.

The free layer 160, is provided, via step 322. The free layer 160 provided in step 322 includes a thermally sensitive multilayer such as the multilayer 112. Thus, in some embodiments, the free layer includes multiple repeats of a RE-TM layer and an amorphous magnetic layer. One or more of blocking layer(s), amorphous magnetic layer(s) and sink layer(s) may also be present. The free layer has a high perpendicular magnetic anisotropy. Thus, the free layer formed in step 322 may have a perpendicular-to-plane magnetic moment.

The nonmagnetic spacer layer, such as the layer 170 is provided, via step 324. Step 324 may include depositing an MgO layer and/or depositing and oxidizing an Mg layer. A tunneling barrier layer may thus be provided. In other embodiments, another nonmagnetic spacer layer may be used.

After the nonmagnetic spacer layer 170 is provided, the portion of the magnetic junction 150 already formed is annealed, via step 326. The anneal may be at an anneal temperature of at least three hundred degrees Celsius and not more than four hundred fifty degrees Celsius. In some embodiments, the anneal temperature may be at least three hundred fifty and not more than four hundred Degrees Celsius. The anneal performed in step 326 may improve the tunneling barrier layer 170.

The PEL 182 may optionally be provided, via step 328. Step 328 may thus deposit a high spin polarization material. After deposition of the PEL in step 328 but before step 330, another anneal is performed, via step 330. The anneal performed in step 330 may use analogous temperatures to the anneal of step 326. If a PEL 182 is not provided, then step 328 may be omitted.

A pinned layer 180 is provided, via step 332. The pinned layer provided in step 332 has a high perpendicular magnetic anisotropy and may include a multilayer.

Although steps 322, 324, 328 and 330 are described as providing specific layers, the edges of each layer is typically not defined until the entire stack has been deposited. The edges of the pinned layer(s), nonmagnetic spacer layer(s) and free layer may be defined at a different time than these layers are deposited. Thus, the steps 322, 324, 328 and 330 may be spread out in time. However, in an alternate embodiment, one or more of the steps 322, 324, 328 and 330 may include not only depositing the layer but also immediately defining the edges of the layer.

Using the method 320, the magnetic junction 100, 100', 150, 150' and/or 150" may be formed. Thus, the benefits of the magnetic junction(s) 100, 100', 150, 150' and/or 150" using one or more of the multilayers 112 and 162 may be achieved.

Figure 10:
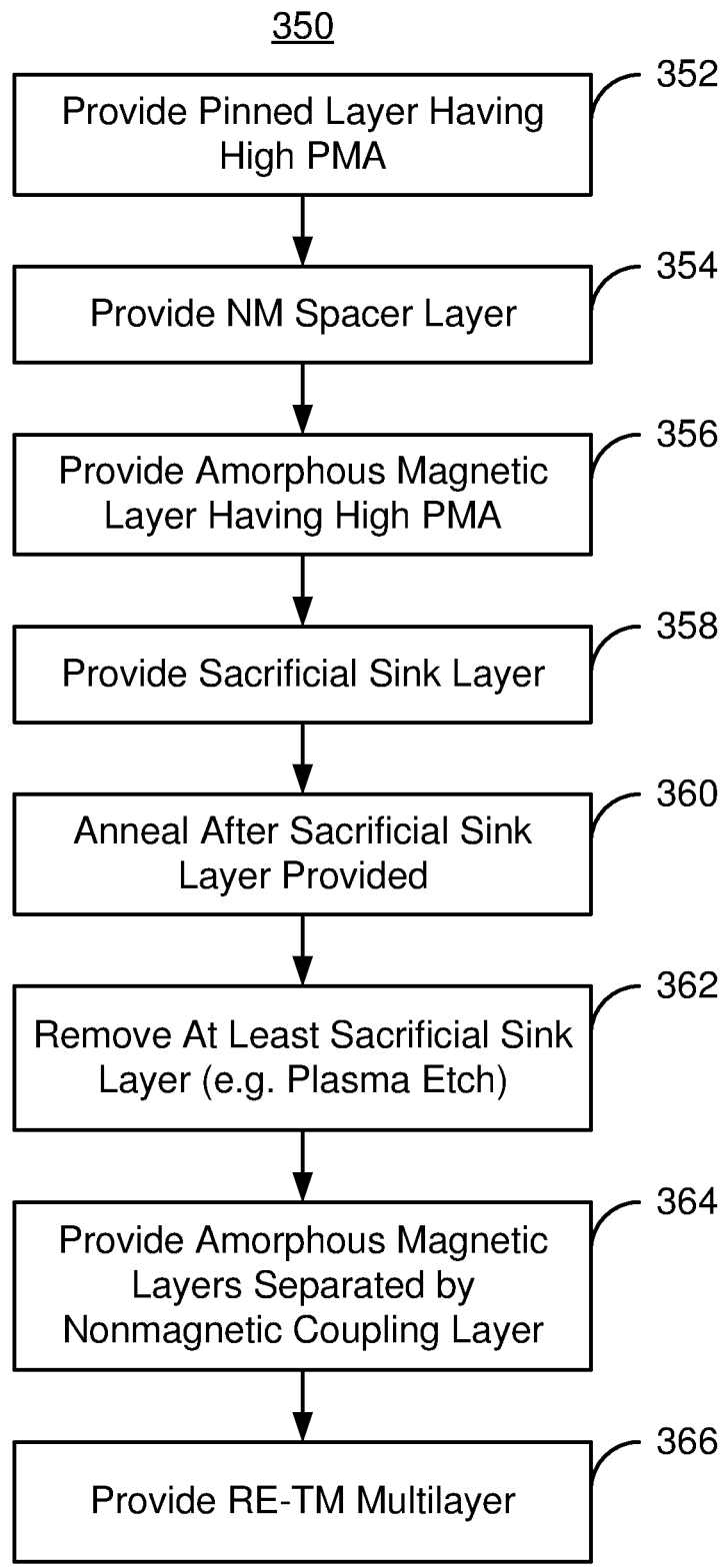
FIG. 10 is a flow chart depicting another exemplary embodiment of a method for providing a magnetic junction including a high perpendicular magnetic anisotropy and thermally sensitive free layer usable in a magnetic memory programmable using spin transfer torque.

FIG. 10 is a flow chart depicting an exemplary embodiment of a method 350 for providing a magnetic junction including a high perpendicular magnetic anisotropy and thermally sensitive free layer usable in a magnetic memory programmable using spin transfer torque, such as a STT- RAM and, therefore, in a variety of electronic devices. For simplicity, some steps may be omitted, performed in another order, include substeps and/or combined. Further, the method 350 may start after other steps in forming a magnetic memory have been performed. For simplicity, the method 350 is described in the context of the magnetic junctions 150". However, other magnetic junctions may be formed.

A pinned layer 180 is provided, via step 382. The pinned layer provided in step 382 has a high perpendicular magnetic anisotropy and may include a multilayer. Further, the pinned layer 180 may be provided before and reside closer to the substrate than the free layer 160.

The nonmagnetic spacer layer, such as the layer 170 is provided, via step 354. Step 354 may include depositing an MgO layer and/or depositing and oxidizing an Mg layer. A tunneling barrier layer may thus be provided. In other embodiments, another nonmagnetic spacer layer may be used.

An amorphous magnetic layer 165 is provide, via step 356. The amorphous magnetic layer 165 may be CoFeB.

A sacrificial sink layer is provided, via step 358. The sink layer is for a more highly diffusing constituent of the amorphous magnetic layer 165. Thus, step 258 may include depositing a Ta sink layer. Ta may be considered a sink for B because it has a relatively high affinity for B. Other materials including but not limited to Ta may also be used. For example, W might be deposited in step 358.

After the sacrificial sink layer is provided, the portion of the magnetic junction 150" already formed is annealed, via step 360. The anneal may be at an anneal temperature of at least three hundred degrees Celsius and not more than four hundred fifty degrees Celsius. In some embodiments, the anneal temperature may be at least three hundred fifty and not more than four hundred Degrees Celsius. The anneal performed in step 360 may improve the crystallization of the amorphous magnetic layer 165.

After the anneal in step 360, at least the sink layer provided in step 358 is removed in step 360. In some embodiments, a portion of the amorphous magnetic layer 165 may also be removed. Step 360 may include performing a plasma etch.

The layers 163, 164 and 165 are provided, via step 362. The multilayer 162 may also be provided, via step 366. Thus, step 356, 358, 360, 362, 364, and 366 may be used to form the free layer 160". The free layer has a high perpendicular magnetic anisotropy. Thus, the free layer 160" have a perpendicular-to-plane magnetic moment.

Although steps 352 through 366 are described as providing specific layers, the edges of each layer is typically not defined until the entire stack has been deposited. The edges of the pinned layer(s), nonmagnetic spacer layer(s) and free layer may be defined at a different time than these layers are deposited. Thus, the steps 352-366 may be spread out in time. However, in an alternate embodiment, one or more of the steps 352-366 may include not only depositing the layer but also immediately defining the edges of the layer A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction residing on a substrate and usable in a magnetic device, the magnetic junction comprising:
a free layer, the free layer being switchable between a plurality of stable magnetic states when a write current is passed through the magnetic junction, the write current generating joule heating in the free layer such that the free layer has a switching temperature greater than room temperature, the free layer having a free layer perpendicular magnetic anisotropy energy greater than a free layer out-of-plane demagnetization energy, the free layer including a multilayer and a rare earth blocking layer, the multilayer being temperature sensitive and including at least one bilayer, each of the at least one bilayer including a first layer and a second layer, the first layer including an alloy of a magnetic transition metal and a rare earth, the second layer including a magnetic layer, the multilayer having a room temperature coercivity and a switching temperature coercivity, the switching temperature coercivity being not more than one-half of the room temperature coercivity;
a nonmagnetic spacer layer; and
a pinned layer, the nonmagnetic spacer layer residing between the pinned layer and the free layer, the pinned layer having a pinned layer perpendicular magnetic anisotropy energy greater than a pinned layer out-of-plane demagnetization energy.

2. The magnetic junction of claim 1 wherein the switching temperature coercivity is not more than one-fourth of the room temperature coercivity.

3. The magnetic junction of claim 1 wherein the magnetic transition metal is Co and the rare earth is Tb such that the first layer includes $Co_xTb_{1-x}$ wherein x is at least 0.4 and not more than 0.5, wherein the magnetic layer includes FeB and wherein the free layer further includes a $(CoFe)_{1-y}B_y$ layer adjoining the multilayer.

4. The magnetic junction of claim 3 wherein the rare earth blocking layer includes a Tb blocking layer, the $(CoFe)_{1-y}B_y$ layer being between the Tb blocking layer and the multilayer.

5. The magnetic junction of claim 4 wherein the Tb blocking layer includes Mg.

6. The magnetic junction of claim 1 wherein the free layer further includes an additional multilayer including a $(CoFe)_{1-w}B_w$ layer, a W layer, a $(CoFe)_{1-z}B_z$ layer and a Fe layer, w being not more than 0.5 and z being not more than 0.5.

7. The magnetic junction of claim 1 wherein the nonmagnetic spacer layer is a crystalline MgO tunneling barrier layer.

8. The magnetic junction of claim 1 further comprising:
an additional nonmagnetic layer, the free layer being between the nonmagnetic layer and the additional nonmagnetic layer; and
an additional pinned layer, the additional nonmagnetic layer being between the free layer and the additional pinned layer.

9. The magnetic junction of claim 1 wherein the free layer is between the substrate and the pinned layer.

10. The magnetic junction of claim 1 wherein an MgO seed layer is between the free layer and the substrate.

11. A magnetic memory residing on a substrate, the magnetic memory comprising:
a plurality of magnetic storage cells, each of the plurality of magnetic storage cells including at least one magnetic junction, the at least one magnetic junction including a pinned layer, a free layer and a nonmagnetic spacer layer between the pinned layer and the free layer, the free layer being switchable between a plurality of stable magnetic states when a write current is passed through the magnetic junction, the write current generating joule heating in the free layer such that the free layer has a switching temperature greater than room temperature, the free layer having a free layer perpendicular magnetic anisotropy energy greater than a free layer out-of-plane demagnetization energy, the free layer including a multilayer and a rare earth blocking layer, the multilayer being temperature sensitive and including at least one bilayer, each of the at least one bilayer including a first layer and a second layer, the first layer including an alloy of a magnetic transition metal and a rare earth, the second layer including a magnetic layer, the multilayer having a room temperature coercivity and a switching temperature coercivity, the switching temperature coercivity being not more than one-half of the room temperature coercivity, the pinned layer having a pinned layer perpendicular magnetic anisotropy energy greater than a pinned layer out-of-plane demagnetization energy; and a plurality of bit lines coupled with the plurality of magnetic storage cells.

12. The magnetic memory of claim 11 wherein the magnetic transition metal is Co and the rare earth is Tb such that the first layer includes $Co_xTb_{1-x}$ where x is at least 0.4 and not more than 0.5 and wherein the magnetic layer includes at least one of FeB and wherein the free layer further includes a $(CoFe)_{1-w}B_w$ layer adjoining the multilayer and an additional multilayer, the rare earth blocking layer including a Mg layer, the $(CoFe)_{1-w}B_w$ layer being between the Mg layer and the multilayer, the additional multilayer including a $(CoFe)_{1-y}B_y$ layer, a W layer, a $(CoFe)_{1-z}B_z$ layer and a Fe layer, w, y and z each being not more than 0.5.

13. A method for providing magnetic junction residing on a substrate and usable in a magnetic device, the method comprising:

providing a free layer, the free layer being switchable between a plurality of stable magnetic states when a write current is passed through the magnetic junction, the write current generating joule heating in the free layer such that the free layer has a switching temperature greater than room temperature, the free layer having a free layer perpendicular magnetic anisotropy energy greater than a free layer out-of-plane demagnetization energy, the free layer including a multilayer and a rare earth blocking layer, the multilayer being temperature sensitive and including at least one bilayer, each of the at least one bilayer including a first layer and a second layer, the first layer including an alloy of a magnetic transition metal and a rare earth, the second layer including a magnetic layer, the multilayer having a room temperature coercivity and a switching temperature coercivity, the switching temperature coercivity being not more than one-half of the room temperature coercivity;

providing a nonmagnetic spacer layer; and providing a pinned layer, the nonmagnetic spacer layer residing between the pinned layer and the free layer, the pinned layer having a pinned layer perpendicular magnetic anisotropy energy greater than a pinned layer out-of-plane demagnetization energy.

14. The method of claim 13 wherein the switching temperature coercivity is not more than one-fourth of the room temperature coercivity.

15. The method of claim 13 wherein the magnetic transition metal is Co and the rare earth is Tb such that the first layer includes $Co_xTb_{1-x}$ where is at least 0.4 and not more than 0.5 and wherein the amorphous magnetic layer includes at least one of FeB and wherein the free layer further includes a $(CoFe)_{1-y}B_y$ layer adjoining the multilayer and an additional multilayer, the rare earth blocking layer including a Mg layer, the $(CoFe)_{1-y}B_y$ layer being between the Mg layer and the multilayer, the additional multilayer including a $(CoFe)_{1-w}B_w$ layer, a W layer, a $(CoFe)_{1-z}B_z$ layer and a Fe layer.

16. The method of claim 13 wherein the nonmagnetic spacer layer is a crystalline MgO tunneling barrier layer.

17. The method of claim 13 wherein an MgO seed layer is between the free layer and the substrate.

18. The method of claim 13 further comprising:

performing an anneal after the nonmagnetic spacer layer providing step and before the step of providing the pinned layer, the anneal being performed at an anneal temperature of at least three hundred degrees Celsius and not more than four hundred fifty degrees Celsius.

19. The method of claim 18 wherein the pinned layer providing step further includes:

providing a polarization enhancement layer adjoining the nonmagnetic spacer layer; and performing an additional anneal after the step of providing the polarization enhancement layer, the additional anneal being at an additional anneal temperature of greater than three hundred degrees Celsius and not more than four hundred fifty degrees Celsius.

20. The method of claim 13 wherein the step of providing the free layer further includes:

depositing an amorphous magnetic layer on the nonmagnetic spacer layer, the amorphous magnetic layer including B;

depositing a sacrificial B sink layer on the amorphous magnetic layer;

performing an anneal at an anneal temperature of at least three hundred degrees Celsius and not more than four hundred degrees Celsius;

removing at least the sacrificial B sink layer after the anneal;

providing the multilayer after the step of removing the at least the sacrificial B sink layer.

21. The magnetic junction of claim 1 wherein the free layer further includes an amorphous magnetic layer between the multilayer and the rare earth blocking layer.

* * * * *